(12) United States Patent
Cao et al.

(10) Patent No.: US 8,962,408 B2
(45) Date of Patent: Feb. 24, 2015

(54) REPLACEMENT GATE SELF-ALIGNED CARBON NANOSTRUCTURE TRANSISTOR

(71) Applicant: International Business Machines Corporation, Armonk, NY (US)

(72) Inventors: Qing Cao, Yorktown Heights, NY (US); Zhengwen Li, Danbury, CT (US); Fei Liu, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 13/909,708

(22) Filed: Jun. 4, 2013

(65) Prior Publication Data

US 2014/0353589 A1 Dec. 4, 2014

(51) Int. Cl.
*H01L 21/338* (2006.01)
*H01L 29/66* (2006.01)
*H01L 29/16* (2006.01)
*H01L 29/786* (2006.01)
*H01L 51/00* (2006.01)
*H01L 51/05* (2006.01)

(52) U.S. Cl.
CPC ...... *H01L 29/66742* (2013.01); *H01L 29/1606* (2013.01); *H01L 29/78684* (2013.01); *H01L 51/0048* (2013.01); *H01L 51/0545* (2013.01); *Y10S 977/938* (2013.01)

USPC .................. 438/183; 257/401; 257/E21.453; 977/938

(58) Field of Classification Search
USPC ........................................... 438/183
See application file for complete search history.

(56) References Cited

U.S. PATENT DOCUMENTS

| 6,852,582 | B2 | 2/2005 | Wei et al. |
| 7,534,675 | B2 | 5/2009 | Bangsaruntip et al. |
| 8,076,204 | B2 | 12/2011 | Anderson et al. |
| 8,288,236 | B2 | 10/2012 | Chang et al. |
| 2008/0121996 | A1 | 5/2008 | Park et al. |
| 2012/0108024 | A1 | 5/2012 | Chang et al. |
| 2012/0138886 | A1 | 6/2012 | Kuhn et al. |
| 2012/0138888 | A1 | 6/2012 | Chang et al. |
| 2012/0161251 | A1* | 6/2012 | Haverty et al. ............... 257/411 |
| 2012/0168872 | A1 | 7/2012 | Chang et al. |
| 2013/0099204 | A1* | 4/2013 | Avouris et al. .................. 257/24 |

* cited by examiner

*Primary Examiner* — Wensing Kuo
*Assistant Examiner* — Shaka White
(74) *Attorney, Agent, or Firm* — Scully, Scott, Murphy & Presser, P.C.; Louis J. Percello, Esq.

(57) ABSTRACT

A self-aligned carbon nanostructure transistor is formed by a method that includes providing a material stack including a gate dielectric material having a dielectric constant of greater than silicon oxide and a sacrificial gate material. Next, a carbon nanostructure is formed on an exposed surface of the gate dielectric material. After forming the carbon nanostructure, metal semiconductor alloy portions are formed self-aligned to the material stack. The sacrificial gate material is then replaced with a conductive metal.

11 Claims, 7 Drawing Sheets

US 8,962,408 B2

REPLACEMENT GATE SELF-ALIGNED CARBON NANOSTRUCTURE TRANSISTOR

BACKGROUND

The present application relates to a semiconductor structure and a method of forming the same. More particularly, the present application relates to a transistor containing a gate structure located atop a carbon nanostructure and positioned between metal semiconductor alloy portions and a method of forming the same.

The integration of carbon nanostructures as channel materials in the next generation of electronic devices offers many advantages over the continued scaling of silicon (Si). Carbon nanotubes and graphene are two nanoscale forms of carbon that exhibit extremely high current carrying capacity and mobilities which are several orders of magnitude beyond the theoretical limit for silicon. Additionally, carbon nanotubes (one-dimensional carbon nanostructures) and graphene (two-dimensional carbon nanostructure) are low-dimensional (ultra thin-body) materials, allowing them to be aggressively scaled in field-effect transistors without incurring deleterious short-channel effects that hinder modern scaled devices.

One of the foremost challenges to scaling carbon nanostructures such as, for example, carbon nanotubes and graphene, is the difficulty of establishing thin, uniform and high-quality dielectrics on their surfaces. The surface of both materials consists of strong $sp^2$ carbon bonds with nominally no surface states. The absence of open surface bonds makes it nearly impossible to nucleate or deposit insulators, especially with the monolayer accuracy that is needed for scaled gate dielectrics.

Additionally, it is desirable to have a self-aligned carbon nanostructure contact process for lowering parasitic resistance. Unfortunately, at the time of filing this application, there is no such process that is presently available.

SUMMARY

A material stack including a gate dielectric material having a dielectric constant greater than silicon and a sacrificial gate material is provided. Next, a carbon nanostructure is formed on an exposed surface of the gate dielectric material. After forming the carbon nanostructure, metal semiconductor alloy portions are formed self-aligned to (i.e., on other side of) the material stack. The sacrificial gate material is then replaced with a conductive metal.

In one aspect of the present application, a method of forming a self-aligned carbon nanostructure transistor is provided. The method of the present application includes providing a material stack located on a surface of a sacrificial structure and positioned between semiconductor material layer portions, wherein the material stack comprises, from bottom to top, a sacrificial gate material portion and a gate dielectric material portion having a dielectric constant of greater than silicon oxide. A carbon nanostructure is then formed on an exposed surface of the gate dielectric material portion. The sacrificial structure is removed to expose a surface of each semiconductor layer portion and the sacrificial gate material. Next, each semiconductor layer portion is converted into a metal semiconductor alloy portion. Then, the sacrificial gate material is replaced with a conductive metal portion which directly contacts a surface of the gate dielectric portion.

In another aspect of the present application, a semiconductor structure, i.e., a self-aligned carbon nanostructure transistor, is provided. The semiconductor structure includes a dielectric material located on a surface of a substrate. The structure further includes a carbon nanostructure embedded within the dielectric material and having an upper surface that is coplanar with an upper surface of the dielectric material. The structure even further includes a gate region located between a pair of spacers and in contact with a surface of the carbon nanostructure. The structure yet even further includes a metal semiconductor alloy portion located on each side of the gate region; each metal semiconductor alloy portion is formed in a self-aligned manner to the gate region. In accordance with the present application, each metal semiconductor alloy portion has a sidewall surface in contact with a sidewall surface of the one of the pair of spacers, and a bottom surface that contacts a portion of the upper surface of the carbon nanostructure and the upper surface of the dielectric material.

DETAILED DESCRIPTION

Figure 1:
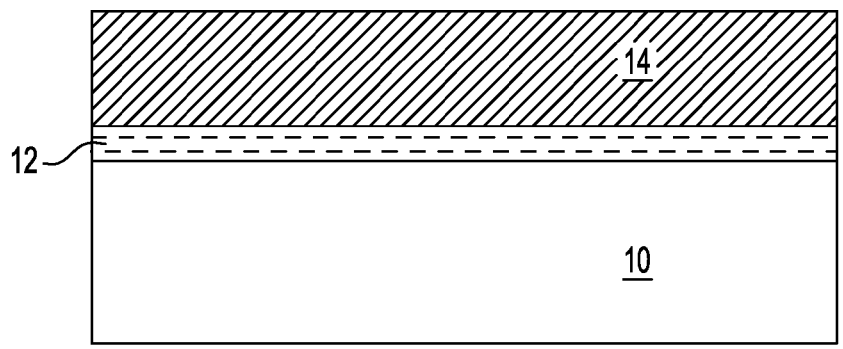
FIG. 1 is a pictorial representation (through a cross sectional view) illustrating an initial structure comprising, from bottom to top, a sacrificial substrate, an etch stop layer and a semiconductor layer that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It is known that carbon nanotube (CNT) transistors exhibit better performance for bottom gate devices due to using gate dielectric materials having a dielectric constant that is greater than silicon oxide (herein after "high k gate dielectrics") which are formed by atomic layer deposition (ALD). However ALD high k gate dielectrics that are deposited on a surface of a CNT are of a poor quality. Also, bottom gate devices experience damage/oxidation during the surface preparation for CNT assembly. Moreover, prior art CNT transistors have a high parasitic capacitance associated therewith.

The present application provides a method of forming a self-aligned carbon nanostructure transistor. The self-aligned structure avoids source-drain to gate overlay, offering a reduced parasitic capacitance and parasitic resistance. In broad terms, the method of the present application includes first forming a material stack comprising a gate dielectric material and a sacrificial gate material. The gate dielectric material has a dielectric constant that is greater than silicon oxide. In some embodiments, an atomic layer deposition process can be used to form a high quality gate dielectric material. By "high quality" it is meant lower interface states between the dielectric material and the carbon nanostructure. Next, a carbon nanostructure is formed on an exposed surface of the gate dielectric material. In some embodiments, a layer transfer process can be used to form the carbon nanostructure on an exposed surface of the gate dielectric material. Next, metal semiconductor alloy portions can be formed self-aligned to the material stack. The sacrificial gate material can than be replaced with a conductive metal.

Reference will now be made to FIGS. 1-16 which illustrated an embodiment of the present application. This exemplary embodiment of the present application represents one possible process flow that can be used to form a self-aligned carbon nanostructure transistor having a reduced parasitic capacitance. Other process flows which include forming a material stack comprising a gate dielectric material and a sacrificial gate material; forming a carbon nanostructure on an exposed surface of the gate dielectric material; forming metal semiconductor alloy portions self-aligned to the material stack; and replacing the sacrificial gate material with a conductive metal can also be used to provide self-aligned carbon nanostructure transistors at a scaled pitch having reduced parasitic capacitance and resistance.

Referring first to FIG. 1, there is illustrated an initial structure (i.e., a layered structure) comprising, from bottom to top, a sacrificial substrate 10, an etch stop layer 12 and a semiconductor layer 14 that can be employed in one embodiment of the present application. The sacrificial substrate 10 and the etch stop layer 12 may be referred to collectively as a sacrificial structure. As shown, the etch stop layer 12 is located directly on an uppermost surface of the sacrificial substrate 10, and the semiconductor layer 14 is located directly on the uppermost surface of the etch stop layer 12.

In one embodiment of the present application, the sacrificial substrate 10 may comprise a bulk semiconductor material. In another embodiment of the present application, the sacrificial substrate 10 may comprise a non-semiconductor material such as, for example, a dielectric material (one example being glass) and/or a conductive material (one example being a metal).

When a bulk semiconductor substrate is employed as the sacrificial substrate 10, the bulk semiconductor substrate can be comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the bulk semiconductor. In one embodiment, the sacrificial substrate 10 can be comprised of a single crystalline semiconductor material, such as, for example, single crystalline silicon. In other embodiments, the sacrificial substrate 10 may comprise a polycrystalline or amorphous semiconductor material. The bulk semiconductor material may be doped (with an n-type or p-type dopant), undoped or contain regions that are doped and other regions that are non-doped.

The etch stop layer 12 is a contiguous layer which is located on the uppermost surface of the sacrificial substrate 10. The etch stop layer 12 typically, but not necessarily always, includes a different dielectric material than a dielectric material used in some embodiments of the present application for the sacrificial substrate 10. The etch stop layer 12 that can be employed in the present application comprises a crystalline or non-non-crystalline dielectric material. Examples of dielectric materials include dielectric oxides, dielectric nitrides, dielectric oxynitrides or multilayered combinations thereof. In one embodiment, the etch stop layer 12 comprises silicon oxide. In another embodiment, the etch stop layer 12 comprises silicon nitride. In one embodiment, the thickness of the etch stop layer 12 may be from 1 nm to 200 nm, although lesser and greater thickness can also be employed for the etch stop layer 12.

The semiconductor layer 14 is a contiguous layer which is located on the uppermost surface of the etch stop layer 12. The semiconductor layer 14 may include one of the semiconductor materials mentioned above for the sacrificial substrate 10. In one embodiment, the semiconductor layer 14 can be comprised of a single crystalline semiconductor material, such as, for example, single crystalline silicon. In other embodiments, the semiconductor layer 14 may comprise a polycrystalline or amorphous semiconductor material. Semiconductor layer 14 may be doped (with an n-type or p-type dopant), undoped or contain regions that are doped and other regions that are non-doped. In one embodiment, the thickness of the semiconductor layer 14 may be from 10 nm to several microns, although lesser and greater thickness can also be employed for the semiconductor layer 14.

In one embodiment of the present application, the initial structure comprising the sacrificial substrate 10, etch stop layer 12 and the semiconductor layer 14 can be a semiconductor-on-insulator substrate in which the sacrificial substrate 10 may be referred to as a handle substrate, the etch stop layer 14 may be referred to as a buried insulating layer, and the semiconductor layer 14 may be referred to as an active semiconductor device layer.

The initial structure shown in FIG. 1 may be formed by techniques that are well known to those skilled in the art. For example, and in one embodiment, the initial structure shown in FIG. 1 can be formed by a SIMOX (separation by ion implantation of oxygen) process. In another example, the initial structure shown in FIG. 1 can be formed by a layer transfer process which may include a material bonding step. In yet another example, the initial structure shown in FIG. 1 can be formed by depositing the etch stop layer 12 and the semiconductor layer 14 atop a performed sacrificial substrate 10.

Figure 2:
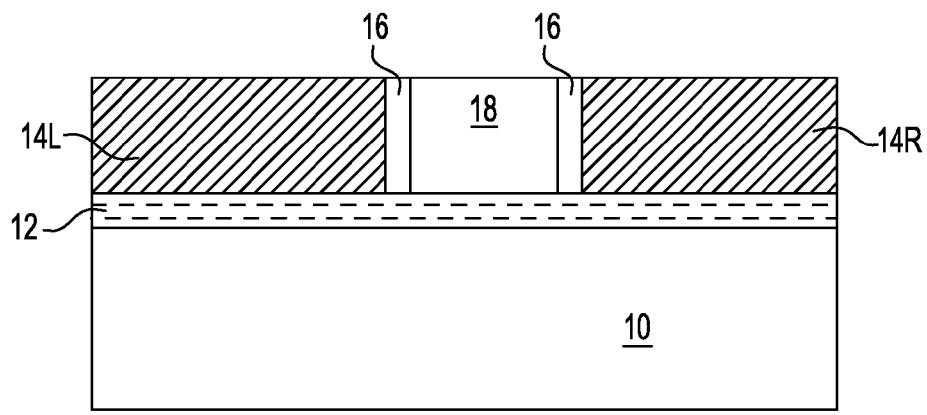
FIG. 2 is a pictorial representation (through a cross sectional view) illustrating the initial structure of FIG. 1 after forming spacers and a sacrificial gate material within an opening provided in the semiconductor layer.

Referring now to FIG. 2, there is illustrated the structure of FIG. 1 after forming spacers 16 and a sacrificial gate material 18 within an opening provided in the semiconductor layer 14. Although a single spacer/sacrificial gate material filled opening is exemplified, a plurality of openings can be formed into the semiconductor layer 14 and each opening can be filled with spacer material and sacrificial gate material.

Specifically, the structure shown in FIG. 2 is formed by first providing an opening (not specifically labeled) within the semiconductor layer 14. The opening can be formed by lithography and etching. Lithography includes forming a photoresist material (not shown) atop the semiconductor layer 14, subjecting the photoresist material to a desired pattern of radiation and developing the resist material utilizing a conventional resist developer. The lithographic step provides a patterned resist material atop the semiconductor layer 14. The pattern within the patterned resist material is then transferred to the underlying semiconductor layer 14 by etching. Etching may include dry etching (i.e., reactive ion etching, plasma etching, ion beam etching or laser ablation) and/or a chemical wet etch. The patterned resist material is removed after transferring the pattern into the semiconductor layer 14 by a conventional stripping process such as, for example, ashing. The semiconductor layer 14 that remains after forming the opening therein can be referred to herein as semiconductor layer portions 14L, 14R.

Each opening that is formed extends down to the uppermost surface of the etch stop layer 12. The width of each opening that is formed, as measured from one exposed sidewall surface to an opposing sidewall surface, is from 10 nm to several microns, although widths that are lesser than or greater than the aforementioned range can also be employed.

After forming the opening, a spacer 16 is formed within each opening and upon each sidewall surface of the remaining semiconductor layer portions 14L, 14R. As shown in FIG. 2, a base of each spacer 16 is present directly on an exposed uppermost surface portion of the etch stop layer 12. The spacers 16 can be formed by first depositing a spacer material and then etching the deposited spacer material. Illustrative examples of spacer materials that can be employed in the present application include a dielectric spacer material such as, for example, silicon oxide, silicon nitride and/or silicon oxynitride. In one embodiment, silicon nitride is used as the spacer material. The spacer material can be deposited, for example, by chemical vapor deposition, or plasma enhanced chemical vapor deposition. The deposited spacer material can then be etched utilizing an anisotropic etch or another like spacer etch process can be used.

The thickness of the spacers 16, as measured from its base, can be from 1 nm to 100 nm. Other thicknesses that are lesser than or greater than the aforementioned range for the spacers 16 can also be employed in the present application.

After forming the spacers 16, the remaining portion of the opening is filled with a sacrificial gate material 18. The sacrificial gate material 18 may include any material including for example, polysilicon, a silicon germanium alloy or an oxide such as, for example, silicon oxide. The sacrificial gate material 18 has a bottommost surface that directly contacts remaining exposed portions of the uppermost surface of etch stop layer 12 and sidewall surfaces that directly contact sidewall surfaces of the spacers 16. The sacrificial gate material 18 also has an uppermost surface that is coplanar with the uppermost surface of the spacers 16 and the uppermost surface of the remaining semiconductor layer portions 14L, 14R.

The sacrificial gate material 18 can be formed by deposition, followed by an optional planarization process. Examples of deposition processes include, but are not limited to, chemical vapor deposition, plasma enhanced chemical vapor deposition, or physical vapor deposition. The optional planarization process that may follow the deposition step can include chemical mechanical polishing and/or grinding.

Figure 3:
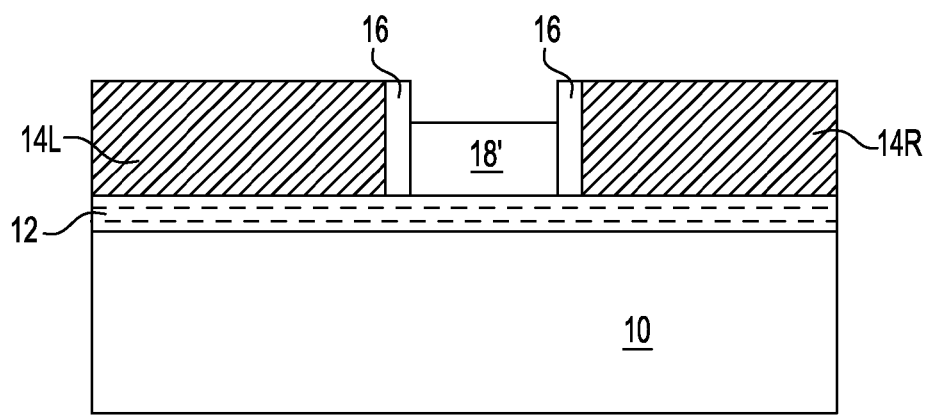
FIG. 3 is a pictorial representation (through a cross sectional view) illustrating the structure of FIG. 2 after recessing the sacrificial gate material below an uppermost surface of the semiconductor layer, and an uppermost surface of each spacer.

Referring now to FIG. 3, there is illustrated the structure of FIG. 2 after recessing the sacrificial gate material 18 below an uppermost surface of the remaining semiconductor layer portions 14L, 14R, and an uppermost surface of each spacer 16. The sacrificial gate material 18 that remains after the recessing can be referred to herein as a sacrificial gate material portion 18'. As shown, the recessing exposes a portion of a sidewall surface of each spacer 16. In one embodiment, the depth of the recess as measured from the uppermost surface of the remaining semiconductor layer portions 14L, 14R to the recessed surface of the sacrificial gate material portion 18' is from several nanometers to several microns.

In some embodiments of the present application, the recessing of the sacrificial gate material 18 can be performed utilizing a timed etching process such as, for example, a timed reactive ion etch process. In other embodiments of the present application, the recessing of the sacrificial gate material can be performed utilizing an etch back process.

Figure 4:
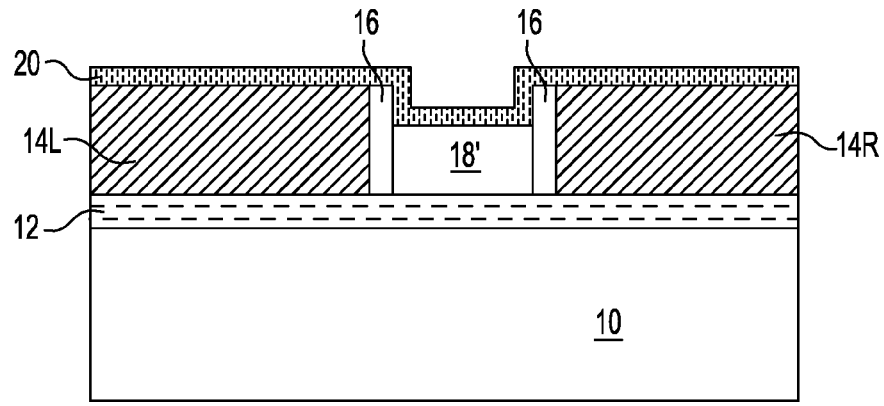
FIG. 4 is a pictorial representation (through a cross sectional view) illustrating the structure of FIG. 3 after forming a dielectric material having a dielectric constant greater than silicon oxide on the uppermost surface of the remaining portions of semiconductor layer, the uppermost surface and exposed sidewall surfaces of each spacer and on the recessed surface of the sacrificial gate material.

Referring now to FIG. 4, there is illustrated the structure of FIG. 3 after forming a dielectric material having a dielectric constant greater than silicon oxide (hereinafter high k gate dielectric 20) on the uppermost surface of the remaining semiconductor layer portions 14L, 14R, the uppermost surface and exposed sidewall surfaces of each spacer 16 and on the recessed surface of the sacrificial gate material portion 18'.

Exemplary high k dielectrics that can be employed in the present application as high k gate dielectric 20 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, or an alloy thereof. Each value of x is independently from 0.5 to 3 and each value of y is independently from 0 to 2. In some embodiments, a multilayered gate dielectric structure comprising different high k gate dielectric materials can be formed.

The high k gate dielectric 20 can be formed by any deposition technique including, for example, chemical vapor deposition (CVD), plasma enhanced chemical vapor deposition (PECVD), physical vapor deposition (PVD), sputtering, or atomic layer deposition (ALD). In one embodiment of the present application, the high k gate dielectric 20 can have a thickness in a range from 1 nm to 10 nm. Other thicknesses that are lesser than or greater than the aforementioned thickness range can also be employed for the high k gate dielectric 20.

Figure 5:
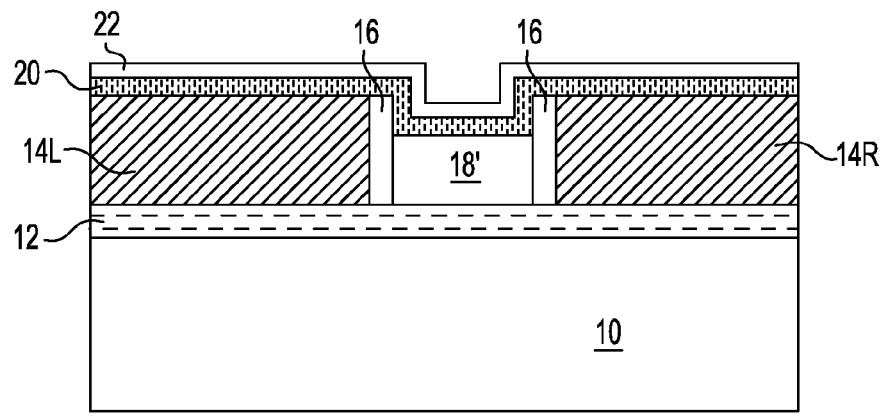
FIG. 5 is a pictorial representation (through a cross sectional view) illustrating the structure of FIG. 4 after forming an optional sacrificial dielectric material on the exposed surface of the dielectric material having a dielectric constant greater than silicon oxide.

Referring now to FIG. 5, there is illustrated the structure of FIG. 4 after forming an optional sacrificial dielectric material 22 on the exposed surface of the high k gate dielectric material 20. The optional sacrificial dielectric material 22 can include one of the dielectric materials mentioned above for the etch stop layer 12. For example, the optional sacrificial dielectric material 22 can include a contiguous layer of an oxide, nitride and/or oxynitride. The optional sacrificial dielectric material 22 can be formed by a deposition process including, for example, chemical vapor deposition (CVD), plasma enhanced chemical vapor deposition (PECVD), physical vapor deposition (PVD), sputtering, or atomic layer deposition (ALD). In one embodiment of the present application, and if present, the optional sacrificial dielectric material 22 can have a thickness in a range from 1 nm to 10 nm. Other thicknesses that are lesser than or greater than the aforementioned thickness range can also be employed for the optional sacrificial dielectric material 22.

Figure 6:
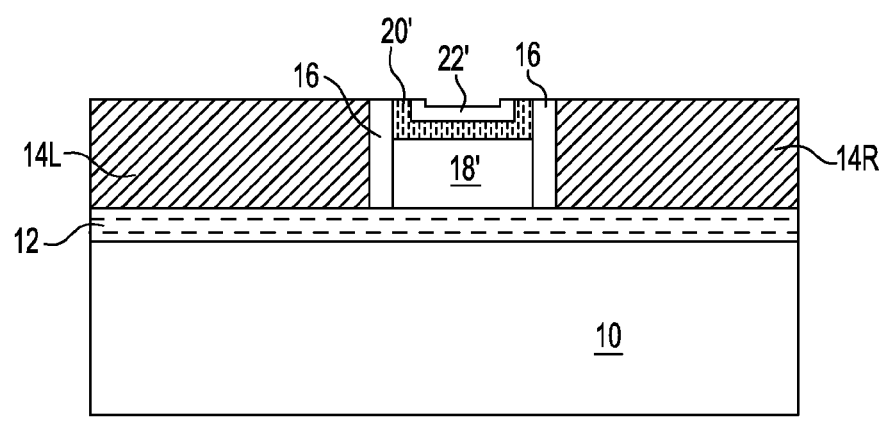
FIG. 6 is a pictorial representation (through a cross sectional view) illustrating the structure of FIG. 5 after removing portions of the optional sacrificial dielectric material and the dielectric material having a dielectric constant greater than silicon oxide from the uppermost surface of the remaining portions of the semiconductor layer.

Referring now to FIG. 6, there is illustrated the structure of FIG. 5 after removing portions of the optional sacrificial dielectric material 22 and the high k gate dielectric material 20 from the uppermost surface of the remaining portions of the semiconductor layer portions 14L, 14R. The remaining portions of the optional sacrificial dielectric material 22 can be referred to herein as optional sacrificial dielectric material portion 22' and the remaining portions of the dielectric material having a dielectric constant greater than silicon oxide can be referred herein to as high k gate dielectric material portion 20' (or, for short, gate dielectric material portion 20'). After the removal step, the optional sacrificial dielectric material portion 22' and high k gate dielectric material portion 20' are present only within the opening previously formed into the semiconductor layer 14. The optional sacrificial dielectric material portion 22' and high k gate dielectric material portion 20' that remain within the opening are now U-shaped.

The removal of portions of the optional sacrificial dielectric material 22 and the high k gate dielectric material 20 from the uppermost surface of the remaining portions of the semiconductor layer portions 14L, 14R can be performed utilizing a planarization process. In one embodiment, the planarization process can include a chemical mechanical polishing process.

Figure 7:
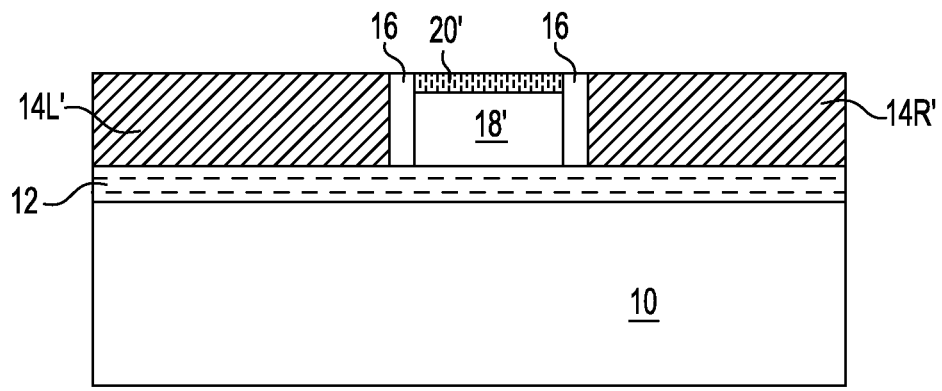
FIG. 7 is a pictorial representation (through a cross sectional view) illustrating the structure of FIG. 6 after planarizing the remaining portions of the semiconductor layer.

Referring now FIG. 7, there is illustrated the structure of FIG. 6 after planarizing the remaining semiconductor layer portions 14L, 14R. During this planarizing step of the present application, the optional sacrificial dielectric material portion 22' and vertical portions of the high k gate dielectric material portion 20' can also be removed exposing a surface of the remaining high k gate dielectric material portion 20'. At this point of the present process, the exposed surface of the remaining high k gate dielectric material portion 20' is coplanar with the remaining portions of each semiconductor layer portion 14L, 14R. The remaining portion of each semiconductor layer portion 14L, 14R can be referred to herein as planarized semiconductor layer portions 14L', 14R'. Each planarized semiconductor layer portion 14L', 14R' has a reduced thickness as compared to the original semiconductor layer 14.

The planarizing process used to form the structure shown in FIG. 7 may include another chemical mechanical polishing step. In some embodiments, the structure shown in FIG. 5 can be subjected to a single planarization process to provide the structure shown in FIG. 7, thus omitting the need to perform the removal step mentioned above in conjunction with providing the structure shown in FIG. 6.

Figure 8:
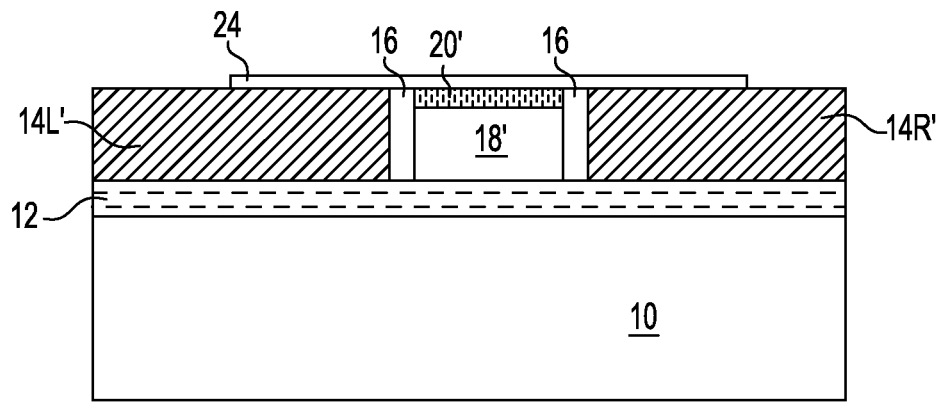
FIG. 8 is a pictorial representation (through a cross sectional view) illustrating the structure of FIG. 7 after applying a carbon nanostructure thereto.

Referring now to FIG. 8, there is illustrated the structure of FIG. 7 after applying a carbon nanostructure 24 to the exposed surfaces of the planarized semiconductor layer portions 14L' 14R', high k gate dielectric material portion 20' and each spacer 16. The carbon nanostructure 24 will serve as a channel layer for the subsequently formed semiconductor device.

In one embodiment of the present application, the carbon nanostructure 24 can be comprised of a carbon nanotube or a plurality of carbon nanotubes. In another embodiment, the carbon nanostructure can be comprised of a layer or multilayers of graphene. A variety of methods can be used to form the carbon nanostructure 24. In one embodiment, transfer techniques such as transfer from a growth substrate for carbon nanotubes or exfoliation for graphene can be employed. These transfer processes are known to those of skill in the art and thus are not described further herein.

In some embodiments and when graphene is employed, the graphene layer can be formed by a deposition process such as chemical vapor deposition (CVD), plasma enhanced chemical vapor deposition (PECVD), or ultraviolet (UV) assisted CVD. The deposition process that can be used in the present application for graphene growth includes utilizing any known carbon sources including, for example, benzene, propane, ethane and other hydrocarbons, and other C-containing gases.

The thickness of the carbon nanostructure 24 can be from 1 nm to 10 nm, although other thicknesses that are lesser than or greater than the aforementioned thickness range can also be employed for the carbon nanostructure 24.

Figure 9:
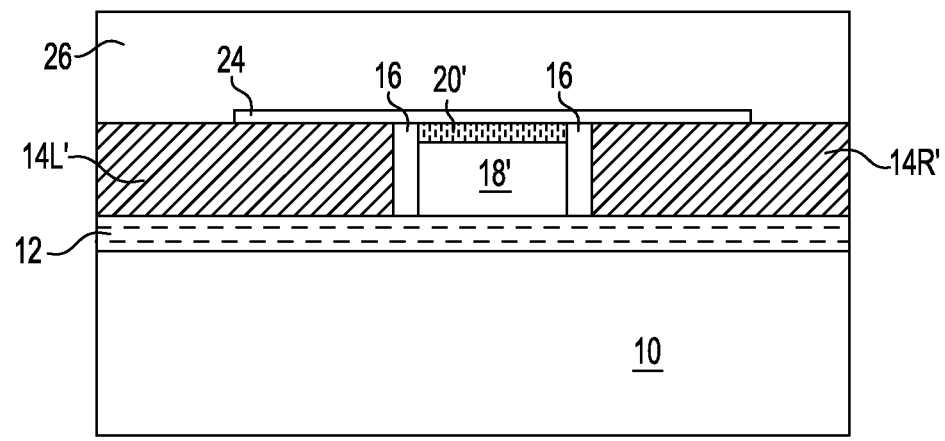
FIG. 9 is a pictorial representation (through a cross sectional view) illustrating the structure of FIG. 8 after forming a dielectric material on exposed surfaces of the carbon nanostructure and the planarized remaining portions of the semiconductor layer.

Referring now to FIG. 9, there is illustrated the structure of FIG. 8 after forming a dielectric material 26 on exposed surfaces of the carbon nanostructure 24 and the planarized semiconductor layer portions 14L', 14R'. The dielectric material 26 may include a dielectric oxide, dielectric nitride and/or dielectric oxynitride. In one embodiment and by way of example, the dielectric material 26 may comprise silicon oxide. In another embodiment, and by way of an example, the dielectric material 26 may comprise silicon nitride. The thickness of the dielectric material 26 can be from 10 nm to several microns, although other thicknesses that are lesser than or greater than the aforementioned thickness range can also be employed for the dielectric material 26. The dielectric material 26 can be formed by any deposition process including, but not limited to, chemical vapor deposition, plasma enhanced chemical vapor deposition, chemical solution deposition, atomic layer deposition or physical vapor deposition.

Figure 10:
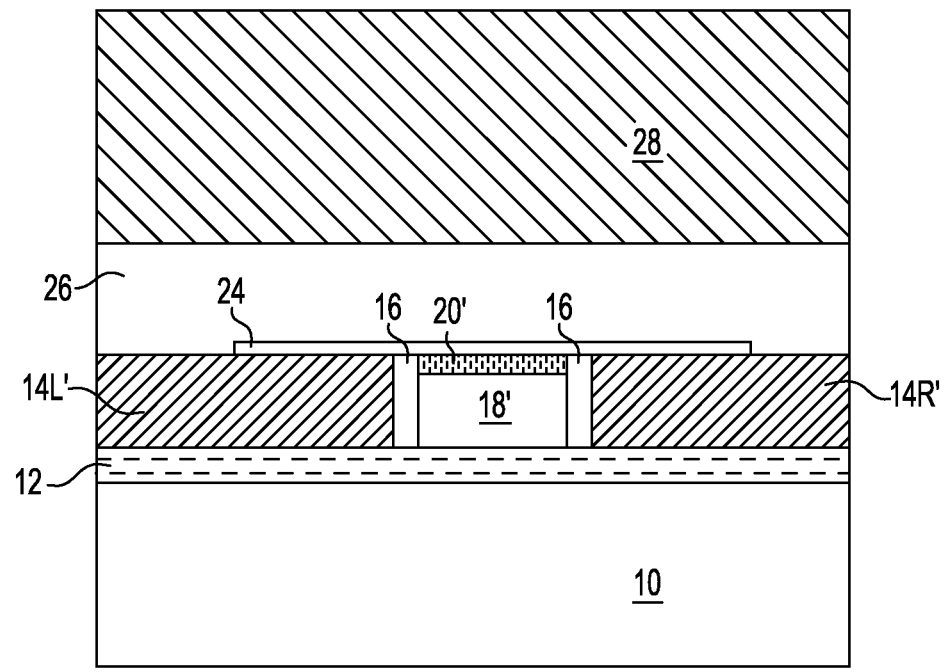
FIG. 10 a pictorial representation (through a cross sectional view) illustrating the structure of FIG. 9 after bonding a substrate to the dielectric material.

Referring now to FIG. 10, there is illustrated the structure of FIG. 9 after bonding a substrate 28 to dielectric material 26. After bonding, a substrate 28/dielectric material interface is formed. Substrate 28 may include one of the materials mentioned above for sacrificial substrate 10. For example, substrate 28 can be a semiconductor material, a dielectric material or a conductive material. The substrate 28 can include one or more semiconductor devices such as, for example, transistors, capacitors, diodes, BiCMOS, resistors, etc. processed on and/or within the substrate 28 prior to bonding utilizing techniques well known to those skilled in the art. In addition to the above mentioned materials, and in other embodiments of the present application, the substrate 28 can include a flexible substrate within or without glass and with or without a carbon nanostructure formed thereon.

The bonding of the substrate 28 to the dielectric material 26 can be performed utilizing any known wafer bonding technique. In some embodiments of the present application, the bonding of substrate 28 to the dielectric material 26 can be performed at a bonding temperature below 450° C. In one example, wafer bonding can be performed at a temperature from 200° C. to 400° C.

Figure 11:
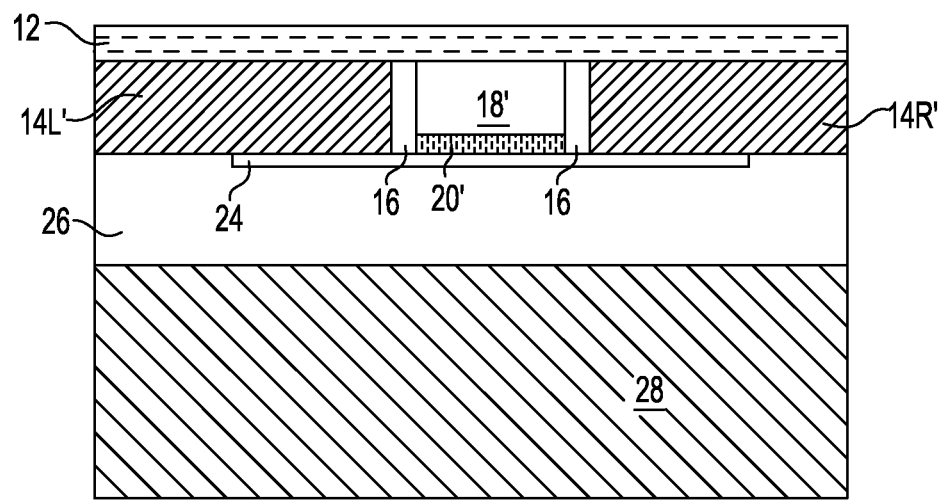
FIG. 11 a pictorial representation (through a cross sectional view) illustrating the structure of FIG. 10 after rotating the structure 180° and then removing the sacrificial substrate exposing a surface of the etch stop layer.

Referring now to FIG. 11, there is illustrated the structure of FIG. 10 after rotating the structure 180° and then removing the sacrificial substrate 10 exposing a surface of the etch stop layer 12. In one embodiment of the present application, a chemical wet etch can be used to remove the sacrificial substrate 10 from the structure. In one example, TMAH can be used as a chemical etchant to remove a sacrificial substrate 10 composed of silicon from the structure. In another embodiment of the present application, a dry etching process can be used to remove the sacrificial substrate 10 from the structure. In one example, the dry etch may include a reactive ion etch. In yet another embodiment of the present application, a planarization process can be used in removing the sacrificial substrate 10 from the structure. In one example, chemical mechanical polishing can be used.

Figure 12:
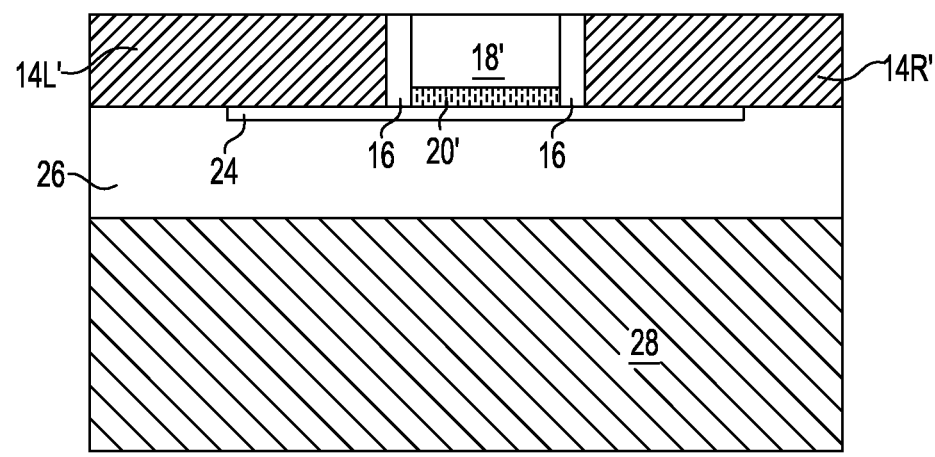
FIG. 12 a pictorial representation (through a cross sectional view) illustrating the structure of FIG. 11 after removing the etch stop layer stopping on a surface of the planarized remaining portions of the semiconductor layer.

Referring now to FIG. 12, there is illustrated the structure of FIG. 11 after removing the etch stop layer 12 stopping on a bottommost surface of the planarized semiconductor layer portions 14L', 14R'. In one embodiment of the present application, a dry etching process can be used to remove the etch stop layer 12 from the structure. In one example, the dry etch may include a reactive ion etch. In yet another embodiment of the present application, a planarization process can be used in removing etch stop layer 12 from the structure from the structure. In one example, chemical mechanical polishing can be used.

Figure 13:
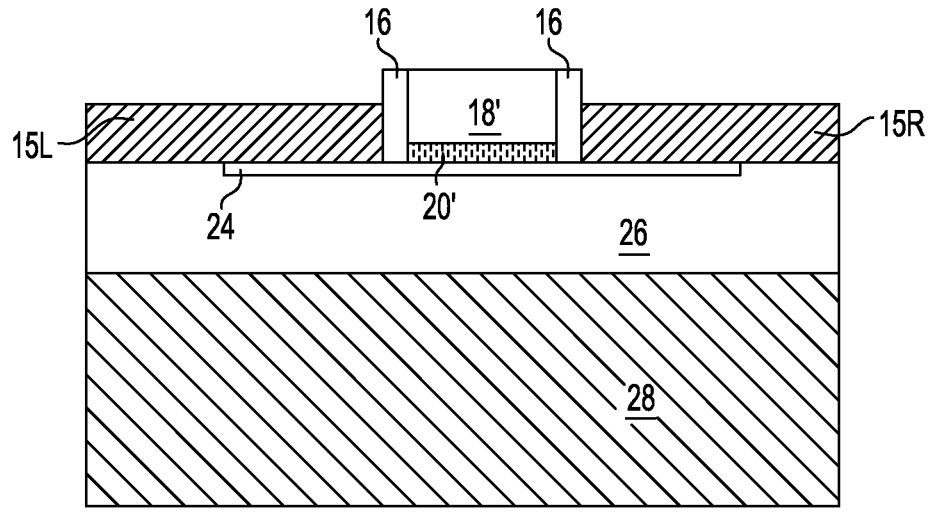
FIG. 13 is a pictorial representation (through a cross sectional view) illustrating the structure of FIG. 12 after performing an optional etch back process.

Referring now to FIG. 13, there is illustrated the structure of FIG. 12 after performing an optional etch back process which recesses the bottommost surface of the planarized semiconductor layer portions 14L', 14R'. The remaining planarized semiconductor layer portions 14L', 14R' can be referred to herein as recessed semiconductor layer portions 15L, 15R. In one embodiment of the present application, the optional etch back process may comprise a reactive ion etch of the semiconductor material. As shown and when the optional etch back process is performed, the recessed semiconductor layer portions 15L, 15R each have an uppermost surface that is below the upper surfaces of the spacers 16 and the sacrificial gate material portion 18'.

Figure 14:
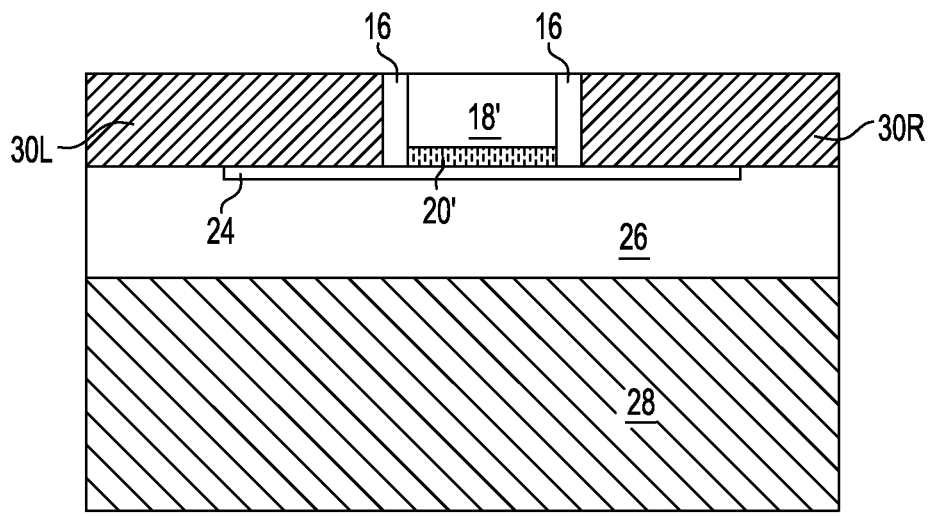
FIG. 14 is a pictorial representation (through a cross sectional view) illustrating the structure of FIG. 13 after converting the recessed portions of the semiconductor layer into metal semiconductor alloy portions.

Referring now to FIG. 14, there is illustrated the structure of FIG. 13 after converting remaining portions of the recessed semiconductor layer portions 15L, 15R into a metal semiconductor alloy portions 30L, 30R. The metal semiconductor alloy portions 30L, 30R function as the source/drain regions of the resultant structure of the present application. The converting of the recessed semiconductor layer portions 15L, 15R into metal semiconductor alloy portions 30L, 30R can include depositing a metal semiconductor alloy forming metal such as for example, Ni, Pt, Co, and alloys such as NiPt, on the surface of the recessed semiconductor layer portions 15L, 15R. An anneal, such as a thermal anneal, is then performed that causes reaction between the metal semiconductor alloy forming metal and the recessed semiconductor layer portions 15L, 15R. After annealing, any unreactive metal can be removed. When Ni is used the NiSi phase is formed due to its low resistivity. In one embodiment, the anneal used in converting the metal semiconductor alloy forming metal and the recessed semiconductor layer portions 15L, 15R into metal semiconductor alloy portions 30L, 30R may be performed at a temperature from 400° C.-600° C.

In some embodiments and as illustrated in the drawings, the entirety of the recessed semiconductor layer portions 15L, 15R is converted into metal semiconductor alloy portions 30L, 30R such that a bottom surface of each metal semiconductor alloy portion 30L, 30R contacts a surface of the carbon nanostructure 24 and the surface of the dielectric material 26. Also, and as shown, sidewall surfaces of each metal semiconductor alloy portion 30L, 30R contracts a sidewall surface of spacer 16. In other embodiments (not illustrated in the drawings), an upper portion of the recessed semiconductor layer portions 15L, 15R is converted into metal semiconductor alloy portions 30L, 30R, while a lower portion of the recessed semiconductor layer portions 15L, 15R remains. In such an embodiment, a bottom surface of each recessed semiconductor layer portion 15L, 15R contacts a surface of the carbon nanostructure 24 and the surface of the dielectric material 26. Also, and in such an embodiment, sidewall surfaces of each metal semiconductor alloy portion 30L, 30R contracts an upper sidewall surface of spacer 16, while sidewall surfaces of the remaining recessed semiconductor layer portions 15L, 15R contact a lower sidewall surface of spacer 16.

In some embodiments, and as shown, the resultant metal semiconductor alloy portions 30L, 30R have upper surfaces that are coplanar with the upper surfaces of the spacers 16 and the sacrificial gate material portion 18'. In other embodiments (not shown), the resultant metal semiconductor alloy portions 30L, 30R have upper surfaces that are vertical offset (i.e., higher or lower) than upper surfaces of the spacers 16 and the sacrificial gate material portion 18'.

Figure 15:
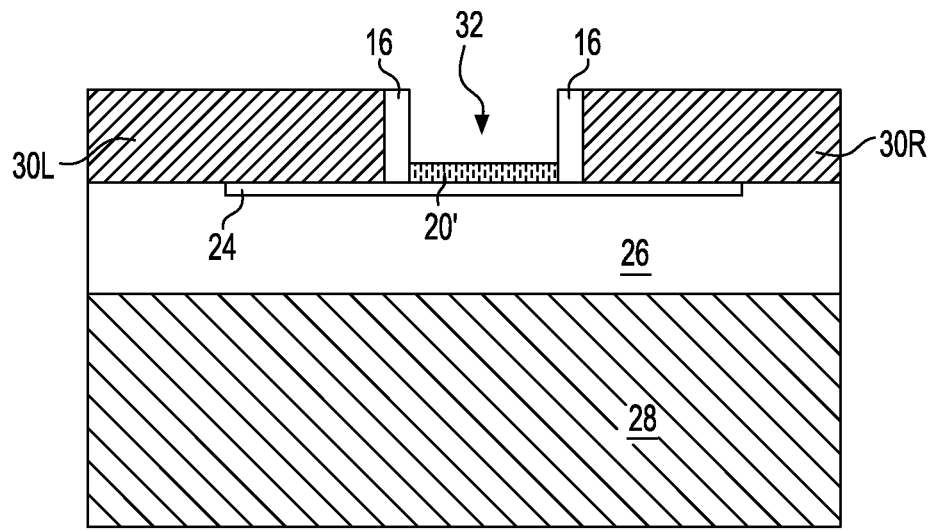
FIG. 15 is a pictorial representation (through a cross sectional view) illustrating the structure of FIG. 14 after removing exposed portions of the sacrificial gate material providing a gate cavity in the area previously occupied by the sacrificial gate material.

Referring now to FIG. 15, there is illustrated the structure of FIG. 14 after removing exposed portions of the sacrificial gate material portion 18' providing a gate cavity 32 in the area previously occupied by the sacrificial gate material portion 18'. Within the gate cavity 32, a surface of the high k dielectric material portion 20' located between the spacers 16 is exposed. In one embodiment of the present application, a chemical wet etch process can be used to remove the sacrificial gate material portion 18' from the structure. In one example, TMAH can be used as the chemical etchant to remove the sacrificial gate material portion 18' from the structure. In another embodiment of the present application, a dry etching process can be used to remove the sacrificial gate material portion 18' from the structure. In one example, reactive ion etching may be used.

Figure 16:
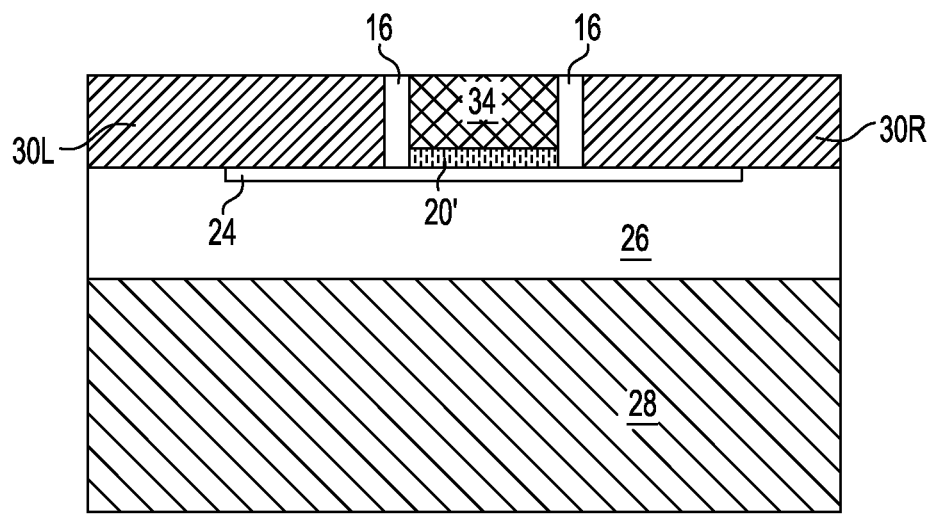
FIG. 16 is a pictorial representation (through a cross sectional view) illustrating the structure of FIG. 15 after forming a conductive metal portion within the gate cavity.

Referring now to FIG. 16, there is illustrated the structure of FIG. 15 after forming a conductive metal portion 34 within the gate cavity 32 and on a surface of the high k gate dielectric material portion 20'. The conductive metal portion 34 that is formed within the gate cavity 32 may comprise an elemental metal (e.g., tungsten, titanium, tantalum, aluminum, nickel, ruthenium, palladium or platinum), an alloy of at least one elemental metal, an elemental metal nitride (e.g., tungsten nitride, aluminum nitride, or titanium nitride), an elemental metal silicide (e.g., tungsten silicide, nickel silicide, or titanium silicide) or multilayered combinations thereof. The conductive metal portion 34 can be formed utilizing a conventional deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed as the conductive metal portion 34, a conventional silicidation process such as the one described above in forming the metal semiconductor alloy portions 30L, 30R can be employed. Also, when a metal silicide is used as the conductive metal portion 34, the metal silicide of the conductive metal portion 34 is typically different in composition and/or phase from that of the metal semiconductor alloy portions 30L, 30R.

As shown, a bottom surface of the conductive metal portion 34 directly contacts the exposed surface of the high k gate dielectric material portion 20'. The conductive metal portion 34 and the high k gate dielectric material portion 20' collectively can be referred to as a gate region. Also, sidewall surfaces of the conductive metal portion 34 directly contact a sidewall surface of the spacers 16. An uppermost surface of conductive metal portion 34 may be coplanar with the uppermost surfaces of the metal semiconductor alloy portions 30L, 30R and the spacers 16. As shown, the conductive metal portion 34 has a sidewall surface that is vertically coincident to a sidewall surface of the high k gate dielectric material portion 20'.

Specifically, FIG. 16 illustrates a semiconductor structure that is formed employing the method of the present application. The semiconductor structure includes a dielectric material 26 located on a surface of a substrate 28. The structure further includes a carbon nanostructure 24 (employed as a channel layer) embedded within the dielectric material 26 and having an upper surface that is coplanar with an upper surface of the dielectric material 26. The structure even further includes a gate region (including, from bottom to top, the high k gate dielectric material portion 20' and the conductive metal portion 34) located between a pair of spacers 16 and in contact with a surface of the carbon nanostructure 24. The structure yet even further includes a metal semiconductor alloy portion 30L, 30R located on each side of the gate region (20', 34). In accordance with the present application, each metal semiconductor alloy portion 30L, 30R has a sidewall surface in contact with a sidewall surface of the one of the pair of spacers 16, and a bottom surface that contacts a portion of the upper surface of the carbon nanostructure 24 and the upper surface of the dielectric material 26. Each metal semiconductor alloy portion 30L, 30R thus is self-aligned to gate region.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   providing a material stack located on a surface of a sacrificial structure and positioned between semiconductor material layer portions, wherein the material stack comprises, from bottom to top, a sacrificial gate material portion and a gate dielectric material portion having a dielectric constant of greater than silicon oxide;
   forming a carbon nanostructure on an exposed surface of the gate dielectric material portion;
   removing the sacrificial structure to expose a surface of each semiconductor layer portion and the sacrificial gate material;
   converting each semiconductor layer portion into a metal semiconductor alloy portion; and
   replacing the sacrificial gate material with a conductive metal portion, wherein the conductive material portion directly contacts a surface of the gate dielectric material portion.

2. The method of claim 1, wherein said carbon nanostructure comprises a carbon nanotube, and wherein said forming the carbon nanostructure comprises a layer transfer process.

3. The method of claim 1, wherein said carbon nanostructure comprises a layer of graphene, and wherein said forming the carbon nanostructure comprises a layer transfer process.

4. The method of claim 1, wherein said carbon nanostructure comprises a layer of graphene, and wherein said forming the carbon nanostructure comprises chemical vapor deposition (CVD), plasma enhanced chemical vapor deposition (PECVD), or ultraviolet (UV) assisted CVD.

5. The method of claim 1, wherein said providing the material stack comprises
   providing a layered structure of, from bottom to top, a sacrificial substrate, an etch stop layer and a semiconductor layer;
   forming an opening within the semiconductor layer;
   forming spacers on sidewall surfaces of each of said semiconductor layer portions by deposition of a spacer material and etching;
   forming a sacrificial gate material within said opening and between said spacers;
   recessing the sacrificial gate material to provide said sacrificial gate material portion;
   forming a gate dielectric material having a dielectric constant of greater than silicon oxide on said sacrificial gate material portion and on each semiconductor layer portion; and
   removing portions of the gate dielectric material atop each semiconductor layer portion forming said gate dielectric portion.

6. The method of claim 1, further comprising forming a sacrificial dielectric material on said gate dielectric material prior to removing portions of the gate dielectric material.

7. The method of claim 6, wherein during said removing said portions of the dielectric material, the sacrificial dielectric material is entirely removed.

8. The method of claim 1, further comprising forming a dielectric material on an exposed surface of the gate dielectric portion and each semiconductor layer portion, and bonding a surface of the dielectric material to a substrate, wherein said forming the layer of dielectric material and bonding occurs prior to removing the sacrificial structure.

9. The method of claim 8, wherein said sacrificial structure comprises, from bottom to top, a sacrificial substrate and an etch stop layer, and wherein said sacrificial substrate is removed first, followed by removing said etch stop layer.

10. The method of claim 1, wherein said converting each semiconductor layer portion into a metal semiconductor alloy portion comprises:
    depositing a metal semiconductor alloy forming metal on the surface of each semiconductor layer portion; and
    annealing.

11. A method of forming a semiconductor structure comprising:
    forming a material stack comprising a gate dielectric material and a sacrificial gate material, wherein said gate dielectric material has a dielectric constant of greater than silicon oxide;
    forming a carbon nanostructure on an exposed surface of the gate dielectric material;
    forming metal semiconductor alloy portions self-aligned to the material stack; and replacing the sacrificial gate material with a conductive metal.

\* \* \* \* \*